United States Patent
Nayfeh et al.

(10) Patent No.: US 8,629,480 B2
(45) Date of Patent: Jan. 14, 2014

(54) HETERO-JUNCTION TUNNELING TRANSISTOR

(75) Inventors: Osama M. Nayfeh, Adelphi, MD (US); Madan Dubey, South River, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 43 days.

(21) Appl. No.: 13/479,392

(22) Filed: May 24, 2012

(65) Prior Publication Data

US 2012/0298960 A1 Nov. 29, 2012

Related U.S. Application Data

(60) Provisional application No. 61/491,061, filed on May 27, 2011.

(51) Int. Cl.
*H01L 29/66* (2006.01)

(52) U.S. Cl.
USPC ............... 257/192; 257/183; 257/E29.242; 257/E29.247; 257/E29.252

(58) Field of Classification Search
USPC ............ 257/12, 30, 183, 192, 194, 288, 329, 257/E29.039, E29.04, E29.081, E29.242, 257/E29.252

See application file for complete search history.

(56) References Cited

U.S. PATENT DOCUMENTS

2012/0298961 A1* 11/2012 Iacopi et al. .................... 257/27

* cited by examiner

*Primary Examiner* — Eduardo A Rodela
(74) *Attorney, Agent, or Firm* — Alan I. Kalb

(57) ABSTRACT

A hetero-junction tunneling transistor having a first layer of p++ silicon germanium which forms a source for the transistor at one end. A second layer of n+ silicon material is deposited so that a portion of the second layer overlies the first layer and forms the drain for the transistor. An insulating layer and metallic gate for the transistor is deposited on top of the second layer so that the gate is aligned with the overlying portions of the first and second layers. The gate voltage controls the conduction between the source and the drain and the conduction between the first and second layers occurs by vertical tunneling between the layers.

9 Claims, 3 Drawing Sheets

HETERO-JUNCTION TUNNELING TRANSISTOR

This application claims the benefit of U.S. Provisional Application No. 61/491,061 filed on May 27, 2011.

GOVERNMENT INTEREST

The invention described herein may be manufactured, used, and licensed by or for the United States Government.

BACKGROUND OF THE INVENTION

I. Field of the Invention

The present invention relates generally to transistors and, more particularly, to a hetero-junction tunneling FET transistor in which the tunneling effect occurs vertically through the semiconductor layers.

II. Description of Material Art

While there are many variations of field effect transistors (FET), in general the previously known field effect transistors include a layer of doped material deposited on a substrate, such as a silicon substrate, so that the conductive semiconductor material forms a source at one end and a drain at the other. A metallic gate is positioned in between the source and the drain and is often insulated from the conductive layer by an insulating layer. Modulation of the voltage applied to the gate then varies the current flow between the source and the drain as a function of the gate voltage.

These previously known field effect transistors, however, all suffer a number of common disadvantages. One disadvantage is that, since the source and drain are necessarily spaced apart from each other, the conduction of electrons between the source and the drain is likewise necessarily lengthy. As a result, transistor noise results as well as relatively slow transistor switching.

A still further disadvantage of the previously known field effect transistors is that an application of relatively large gate voltages was required in order to adequately render the layer between the drain and the source conductive. This, in turn, results not only in increased power usage and consumption, but also heat dissipation of the transistor.

SUMMARY OF THE PRESENT INVENTION

The present invention provides a hetero-junction tunneling FET transistor that overcomes all of the above-mentioned disadvantages of the previously known field effect transistors.

In brief, the hetero-junction tunneling transistor of the present invention comprises a first p++ silicon germanium layer having the transistor source at one end. The thickness of the silicon germanium layer is very small, e.g. 5 nanometers, but with a relatively high p++ doping of $10^{20}$ holes per cubic centimeter.

An n+ silicon layer is then deposited so that a portion of the silicon layer overlies only a portion of the silicon germanium layer. The exposed end of the silicon layer forms the drain for the transistor. This silicon layer is also highly doped, e.g. $10^{19}$ electrons per cubic centimeter.

An insulator and metallic layer is then deposited on top of the silicon layer so that the metal layer forms the gate for the transistor. Furthermore, the gate as well as the insulator overlie the overlapping portions of the silicon and germanium layer as well as the silicon layer.

With a voltage differential applied between the drain and the source, voltage modulation of the gate varies the conduction between the drain and source through vertical electron tunneling between the silicon germanium layer and the silicon layer.

Since the transistor of the present invention utilizes electron tunneling for conduction between the source and drain, a substantial reduction in transistor noise is achieved as compared to the previously known field effect transistors. Furthermore, the conduction between the source and drain through electron tunneling also occurs much more rapidly thus allowing high speed switching in the gigahertz range. Power consumption, and the resultant heat generated by the transistor, is also greatly reduced due to the lower gate voltages necessary to control conduction between the source and drain as well as lower voltage differential between the source and drain.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION OF A PREFERRED EMBODIMENT OF THE PRESENT INVENTION

Figure 1:
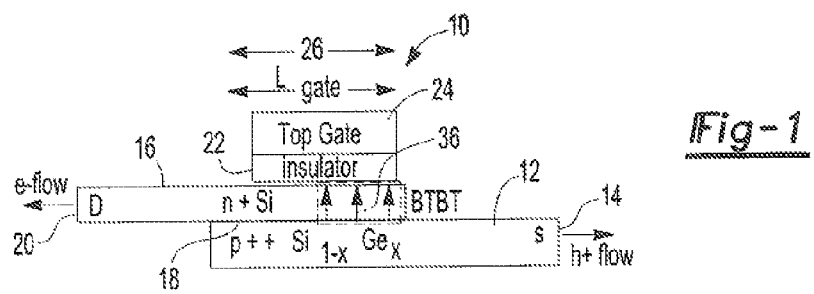
FIG. 1 is a diagrammatic cross-sectional view of a preferred embodiment of the hetero-junction tunneling transistor of the present invention.

With reference first to FIG. 1, a diagrammatic cross-sectional view of a preferred embodiment of the hetero junction tunneling FET transistor of the present invention is shown. The transistor 10 includes a p++ silicon germanium first layer 12 which forms a source 14 for the transistor 10 at one end. Conventional metal pads (not shown) may be used to connect the source 14 to the appropriate connectors.

The thickness of the silicon germanium layer 12 is relatively thin, e.g. 5 nanometers, and is highly p+ doped. For example, the silicon germanium layer 12 is preferably doped in the range of about $10^{20}$ holes per cubic centimeter.

An n+ silicon layer 16 overlies only a portion 18 of the silicon germanium layer 12.

A portion of the silicon layer extends outwardly away from the silicon germanium layer 12 and forms a drain 20 for the transistor 10. Any conventional metal pads (not shown) may be used to electrically connect the drain 20 to the other circuitry.

The silicon layer 16 is relatively thin, e.g. about 3 nanometers, and is highly n+ doped, e.g. $10^{19}$ electrons Per cubic centimeter. Consequently, the doping of the silicon germanium layer 12 is within an order of magnitude of doping as the silicon layer 16.

An insulating layer 22 and gate 24 then overlie the overlapping portion 18 of the silicon germanium layer 12 and the silicon layer 16. The insulating layer may be constructed of any conventional insulating material while the gate 24 is constructed of a conductive material, such as metal. The gate 24, furthermore, has a defined length 26, preferably less than 10 nanometers, all of which overlies the overlapping portion 18 of the silicon germanium layer 12 and silicon layer 16.

The insulating layer 22 preferably has an equivalent oxide thickness (EOT) of about 0.5 nanometers. Consequently, the actual thickness of the insulating layer 22 will vary as a function of the dielectric constant of the insulator 22. The higher the dielectric constant, the thinner the insulating layer 22 and vice versa.

In operation, an electric voltage potential, e.g. 0.3 volts, is applied between the source 14 and the drain 20. The voltage on the gate 24 is then used to modulate the surface potential of the silicon layer 16 and thus modulate the conduction between the source 14 and drain 20.

Figure 2:
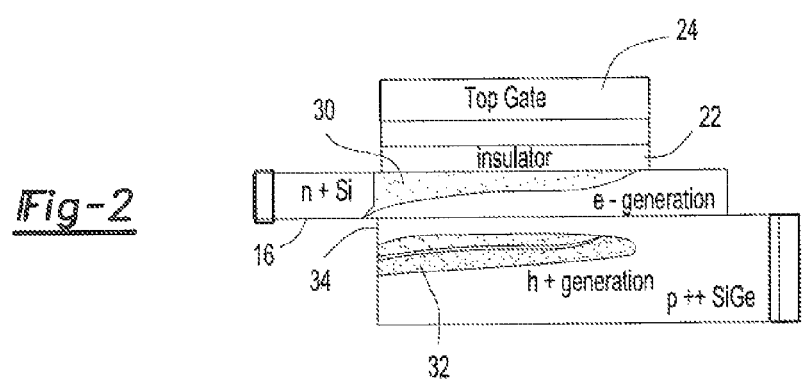
FIG. 2 is a simulated contour plot of the electron and hole generation rates.

With reference now to FIGS. 1 and 2, FIG. 2 is a simulated contour plot of the electron and hole generation rates upon the application of a voltage to the gate 24. Upon the application of a relatively low gate voltage, e.g. 0.3 volts, the gate 24 induces a conduction band 30 in the silicon layer 16 and a valance band 32 in the silicon germanium layer 12. These two bands 30 and 32, furthermore, are separated from each other vertically by a band gap 34. Consequently, under this condition, conduction between the source 14 and drain 20 occurs through the tunneling effect of electrons through the band gap 34 as depicted by the arrows 36 (FIG. 1). Since the conduction between the layers 12 and 16 occurs vertically via the tunnel effect, high speed and power efficient switching of the transistor 10 can be achieved with low noise.

Figure 3:
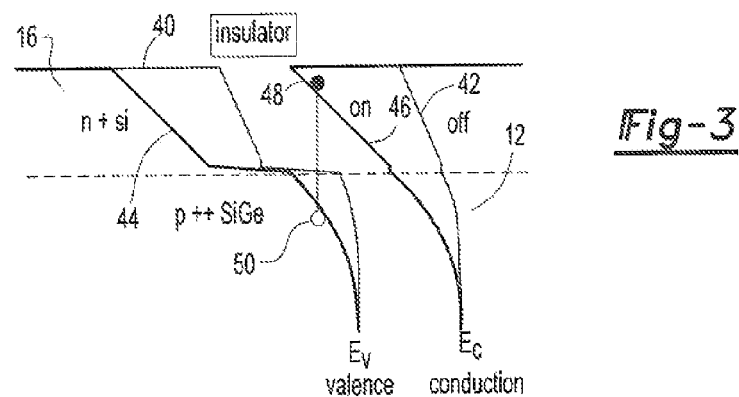
FIG. 3 is a plot of a simulated energy band diagram of the transistor of the present invention.

The operation of the tunneling effect vertically between the silicon germanium layer 12 and the silicon layer 16 is clarified by reference to FIG. 3 in which the cross section energy levels for the silicon germanium layer 12 and silicon layer 16 are shown. With the transistor in an off condition, the energy level for the valance band is illustrated by graph 40 and the energy level for the conduction band is illustrated by graph 42. As is clear from FIG. 3, the energy levels for the valence band and conduction band are not vertically aligned when the transistor 10 is in an off condition.

Conversely, graph 44 illustrates the energy level for the valence band when the transistor is in an on or conducting condition while graph 46 illustrates the energy level for the conduction band for the transistor when turned on or conducting. The portions of the bands 44 and 46 overlap which allow vertical tunneling between the electrons 48 and holes 50. Since both the silicon germanium layer 12 and silicon layer 16 are highly, but oppositely, doped, sufficient conduction between the source and drain occurs through the tunneling effect or band to band tunneling as shown by arrow 51.

Figure 4:
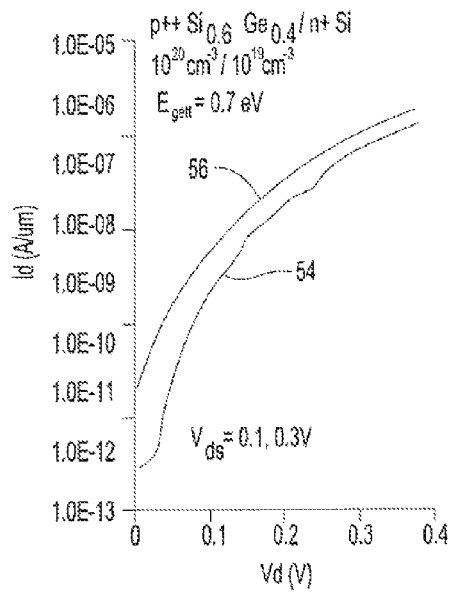
FIG. 4 is a plot of the drain current versus gate voltage.

With reference now to FIG. 4, a graph of the drain current $I_d$ in amperes per micrometers on the Y axis versus the gate voltage is shown for a drain and source differential of 0.1 volts in graph 54 and a voltage differential across the source 14 and drain 16 for 0.3 volts in graph 56. FIG. 4 thus demonstrates that the current between the source 14 and drain 16 varies almost solely as a function of the gate voltage with only a minor effect of varying the voltage between the drain and source.

Figure 5:
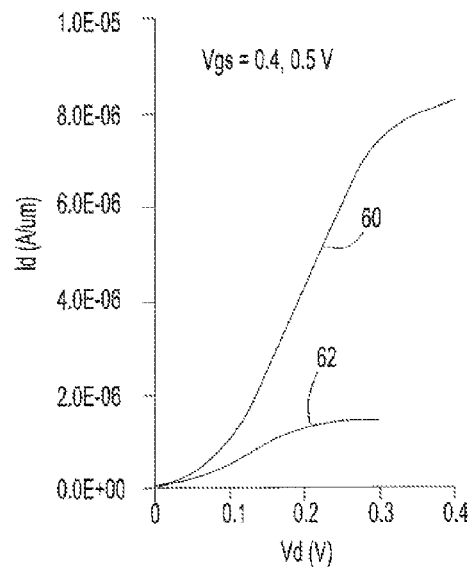
FIG. 5 is a graph of the drain current versus the drain voltage.

With reference now to FIG. 5, FIG. 5 illustrates the gain achieved by the transistor as a function of the gate to source voltage differential. Specifically, graph 60 illustrates the transistor gain of the drain current versus drain voltage for a gate to source voltage differential of 0.5 volts. Graph 62 illustrates the transistor gain for a gate to source voltage differential of 0.4. As is clear from FIG. 5, at a drain voltage of 0.3 volts, the transistor gain at a gate to source voltage differential of 0.5 is approximately four times the gain when the gate to source voltage differential is 0.4.

Figure 6:
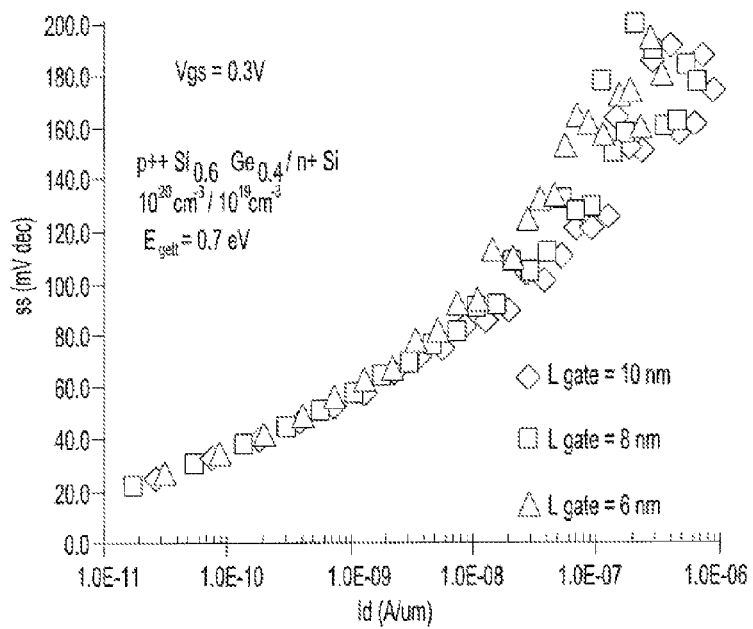
FIG. 6 is a graph illustrating the simulated SS versus the drain current for different lengths of gates.

With reference now to FIG. 6, FIG. 6 depicts the subthreshold swing in millivolts per decade on the Y axis versus the drain current in amperes per micrometers on the X axis for three different lengths 26 of the gate 24. Specifically, graph 70 corresponds to a gate length of 6 nanometers, graph 72 corresponds to a gate length of 8 nanometers, while graph 74 corresponds to a gate length 26 of 10 nanometers. FIG. 6 thus demonstrates that the subthreshold swing versus drain current remains largely unaffected for different gate lengths 26.

Figure 7:
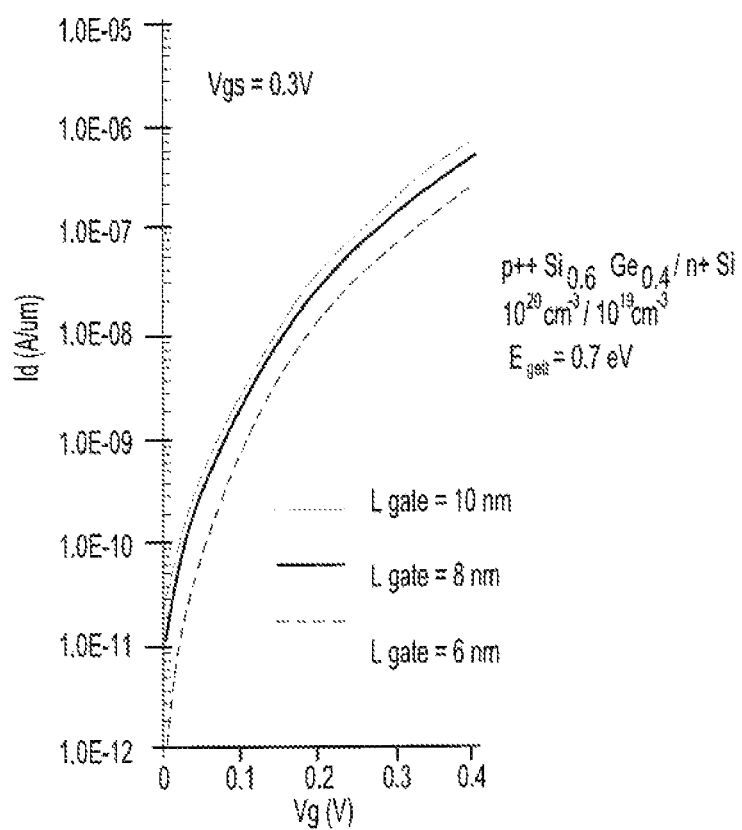
FIG. 7 is a simulated transfer characteristic of drain current versus gate voltage for different lengths of the gate.

Similarly, FIG. 7 depicts the drain current $I_d$ on the Y axis as a function of the gate voltage $V_g$ on the X axis for three different gate lengths 26. Specifically, graph 80 corresponds to a gate length of 10 nanometers, graph 82 corresponds to a gate length of 8 nanometers, and graph 84 corresponds to a gate length 26 of 6 nanometers. FIG. 7 thus demonstrates that the gain of the transistor is largely unaffected by differing lengths 26 of the gate 24.

From the foregoing, it can be seen that the present invention provides a high speed, power efficient, and virtually noise free hetero junction, FET transistor which utilizes vertical tunneling as a conduction mode between the drain and the source. All of these attributes of the transistor 10 enable it to be used for many applications, such as high speed switching applications and low noise applications. Furthermore, since variations in the size of the components, e.g. the length of the gate 24, have only minimal effect on the overall operation of the transistor, the transistor may be scaled as required without significant impact on the operational characteristics of the transistor.

Having described our invention, many modifications will become apparent thereto to those skilled in the art to which it pertains without deviation from the spirit of the invention as defined by the scope of the appended claims.

We claim:

1. A hetero-junction tunneling transistor comprising:
    a first layer of p++ doped semiconductor material forming a source at one end,
    a second layer of n+ doped semiconductor material different from said first semiconductor material and overlying a portion of said first layer, said second layer forming a drain at one end,
    an insulator layer on said second layer which is aligned with said overlying portion of said first layer,
    a conductive layer on said insulating material which forms a gate.

2. The hetero junction tunneling transistor as defined in claim 1 and comprising a substrate which supports said first and second layers.

3. The hetero-junction tunneling transistor as defined in claim 1 wherein said first layer comprises silicon and germanium.

4. The hetero-junction tunneling transistor as defined in claim 1 wherein said second layer comprises silicon.

5. The hetero junction tunneling transistor as defined in claim 1 wherein said first and second layers are sufficiently doped to enable vertical tunneling between said first and second layer upon application of a voltage on said gate.

6. The hetero-junction tunneling transistor as defined in claim 1 wherein said first layer is p++ doped approximately $10^{20}$ holes/centimeter$^2$.

7. The hetero-junction tunneling transistor as defined in claim 1 wherein said second layer is n+ doped approximately $10^{19}$ electrons/centimeter$^2$.

8. The hetero-junction tunneling transistor as defined in claim 1 wherein said gate overlies only a portion of said first and second layers.

9. The hetero-junction tunneling transistor as defined in claim 1 wherein the length of said gate is less than 10 nanometers.

* * * * *